United States Patent
Bayerer et al.

(10) Patent No.: US 8,472,949 B2
(45) Date of Patent: Jun. 25, 2013

(54) SEMICONDUCTOR ASSEMBLY

(75) Inventors: Reinhold Bayerer, Warstein (DE); Markus Thoben, Soest (DE)

(73) Assignee: Infineon Technologies AG, Neubiberg (DE)

( * ) Notice: Subject to any disclaimer, the term of this patent is extended or adjusted under 35 U.S.C. 154(b) by 1306 days.

(21) Appl. No.: 11/816,340

(22) PCT Filed: Jan. 19, 2006

(86) PCT No.: PCT/EP2006/000457
§ 371 (c)(1),
(2), (4) Date: May 16, 2008

(87) PCT Pub. No.: WO2006/087065
PCT Pub. Date: Aug. 24, 2006

(65) Prior Publication Data
US 2009/0016088 A1    Jan. 15, 2009

(30) Foreign Application Priority Data
Feb. 17, 2005   (DE) .................. 10 2005 007 373

(51) Int. Cl.
*H04W 4/00* (2009.01)
(52) U.S. Cl.
USPC ........ 455/433; 455/466; 455/419; 455/456.1; 455/558; 235/380; 235/462.01
(58) Field of Classification Search
USPC ....... 455/433, 466, 419, 456.1, 558; 235/380, 235/462.01
See application file for complete search history.

(56) References Cited

U.S. PATENT DOCUMENTS

| | | | |
|---|---|---|---|
| 4,458,305 A | | 7/1984 | Buckle et al. |
| 4,724,474 A | | 2/1988 | Duchek et al. |
| 2002/0067255 A1* | | 6/2002 | Tanizawa ..................... 340/514 |
| 2002/0153586 A1 | | 10/2002 | Majumdar et al. |
| 2004/0012064 A1 | | 1/2004 | Yoshizaki et al. |
| 2004/0032011 A1* | | 2/2004 | Warner et al. ................. 257/676 |
| 2005/0218426 A1* | | 10/2005 | Kobayashi et al. ........... 257/177 |
| 2006/0006459 A1* | | 1/2006 | Yoshikawa .................... 257/330 |
| 2008/0093729 A1* | | 4/2008 | Siepe et al. ................... 257/703 |

FOREIGN PATENT DOCUMENTS

| | | |
|---|---|---|
| DE | 9200300.9 | 7/1992 |
| DE | 10103472 A1 | 8/2002 |
| DE | 10320877 A1 | 12/2004 |
| DE | 10329101 A1 | 1/2005 |
| DE | 10333329 | 3/2005 |
| EP | 0706221 | 4/1996 |
| EP | 1378941 | 1/2004 |
| JP | 58147351 A | 9/1983 |

(Continued)

*Primary Examiner* — Telly Green
(74) *Attorney, Agent, or Firm* — Dicke, Billig & Czaja, PLLC

(57) ABSTRACT

A semiconductor assembly is disclosed. One embodiment provides a first semiconductor and a second semiconductor, each having a first main connection and a second main connection arranged on opposite sides, and a carrier having a patterned metallization with a first section spaced apart from a second section. The first semiconductor is electrically connected to the first section by its second main connection, and the second semiconductor electrically connected to the second section by its second main connection. The first semiconductor chip first main connection and the second semiconductor chip first main connection are electrically connected to one another and for the connection of an external load or of an external supply voltage.

31 Claims, 13 Drawing Sheets

FOREIGN PATENT DOCUMENTS

| | | |
|---|---|---|
| JP | 7256147 A | 10/1995 |
| JP | 10289999 A | 10/1998 |
| JP | 2000125560 A | 4/2000 |
| JP | 2001085612 A | 3/2001 |
| JP | 2002043508 A | 2/2002 |
| JP | 2002093995 A | 3/2002 |
| JP | 2004140068 A | 5/2004 |
| JP | 2004186504 A * | 7/2004 |
| JP | 2005184981 A | 7/2005 |
| WO | 0303247 | 4/2003 |
| WO | 03030247 A2 | 4/2003 |
| WO | 2006087065 | 8/2006 |

* cited by examiner

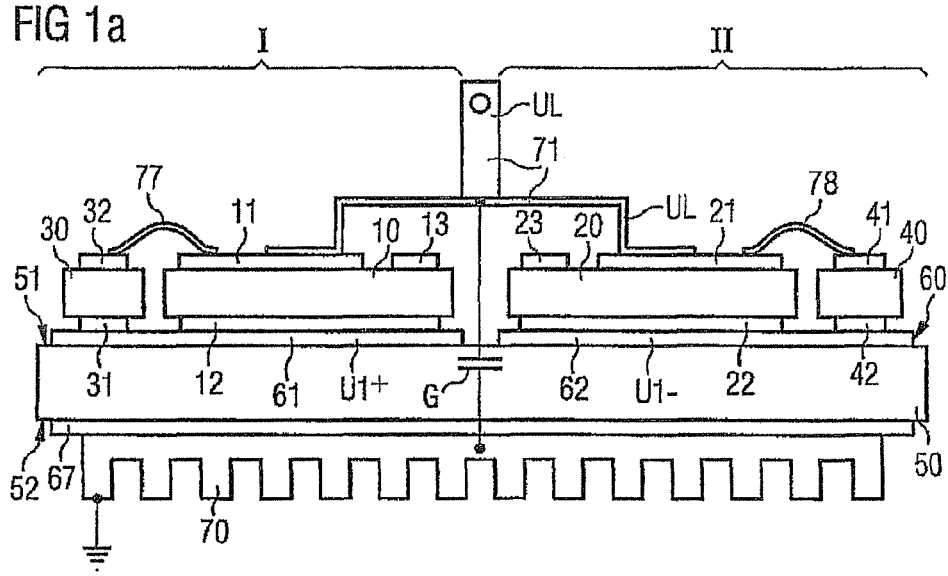
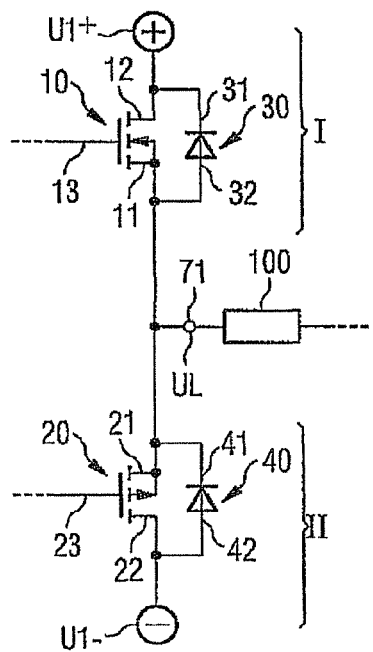
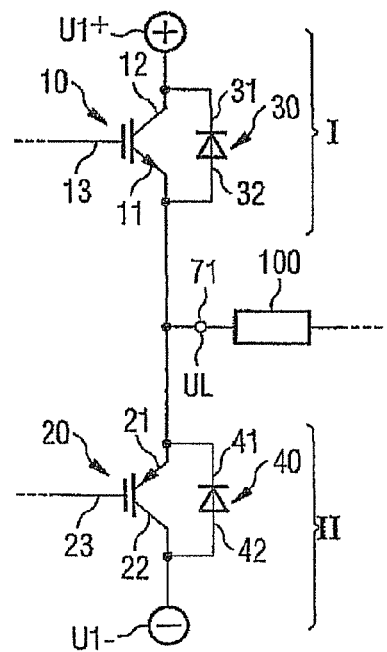

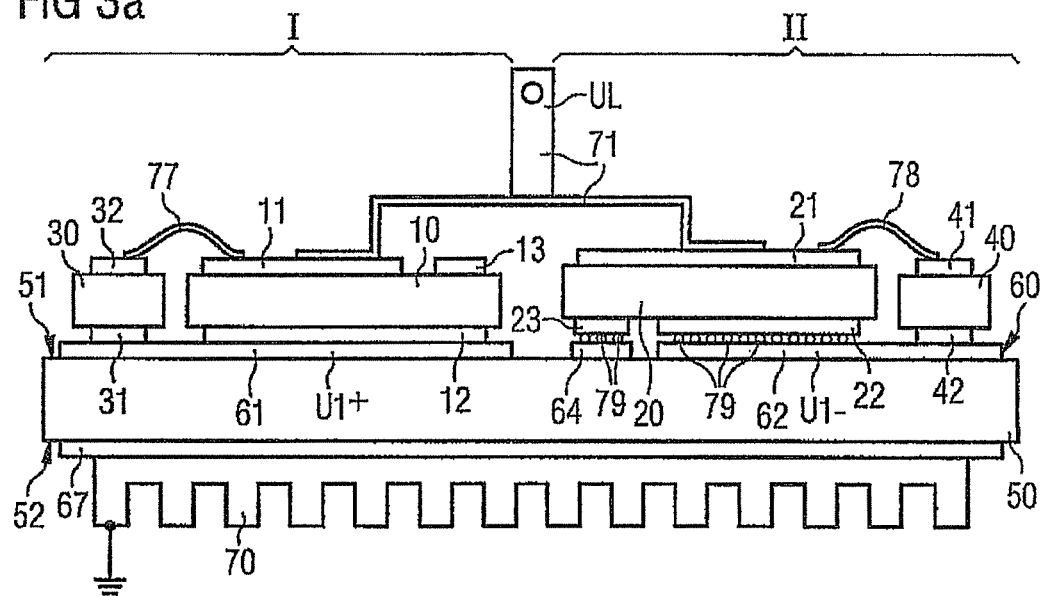

US 8,472,949 B2

SEMICONDUCTOR ASSEMBLY

CROSS REFERENCE TO RELATED APPLICATION

This Utility Patent Application claims the benefit of the filing date of German Application No. Germany 10 2005 007 373.5, filed Feb. 17, 2005, and International Application No. PCT/EP2006/000457, filed Jan. 19, 2006, both of which are herein incorporated by reference.

BACKGROUND

The invention relates to a semiconductor assembly including a power semiconductor assembly.

Power semiconductor assemblies of this type typically include one or more semiconductor chips mounted on a common carrier. In general, each of the semiconductor chips has two main connections which, in particular in the case of vertical components, are arranged on mutually opposite sides of the semiconductor chip.

It is customary for the individual chips to be electrically conductively mounted in each case on a carrier that simultaneously forms a connection of the component.

In general, power semiconductor assemblies of this type are used for switching a load. For this purpose, one of the main connections is electrically conductively connected to the load and the other of the main connections is electrically conductively connected to a supply voltage, one of the connections being formed by the carrier.

Such power semiconductor assemblies are often thermally contact-connected to a heat sink opposite the semiconductor chips in order to dissipate the heat loss arising in the semiconductor chips. Instead of the heat sink or in addition to the latter, a metal plate, a heat accumulator or a metallic film can be arranged on that side of the carrier which is remote from the semiconductor chips.

Coupling capacitances are formed here at any rate between those main connections of the semiconductor chips which face the carrier and a metallization of the carrier that is electrically conductively connected thereto, on the one hand, and the heat sink and/or the heat accumulator and/or the metal plate and/or the metallic film, which coupling capacitances lead to circuit losses particularly at high switching frequencies. If the heat sink, the heat accumulator, the metal plate or the metallic film is grounded, then the circuit losses essentially result from displacement currents in the ground conductor, and without grounding essentially from the emission of electromagnetic waves.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a side view of one embodiment of a power semiconductor assembly that is formed as a half-bridge, with two mutually complementary semiconductor chips, and also two corresponding circuit diagrams with two field-effect transistors and two bipolar transistors, respectively.

FIG. 3 illustrates one embodiment of a power semiconductor assembly that is formed as a half-bridge, with two equivalent semiconductor chips, of which the semiconductor chip assigned to the lower half-bridge branch is connected to a carrier in flip-chip arrangement, and also two corresponding circuit diagrams.

FIG. 6b illustrates a temporal profile of the output voltage of the first semiconductor chip in accordance with FIG. 6a.

FIG. 6c illustrates a temporal profile of the output voltage of the second semiconductor chip in accordance with FIG. 6a.

FIG. 7b illustrates a temporal profile of the output voltage of the combined drive circuit in accordance with FIG. 7a.

DETAILED DESCRIPTION

Figure 2A:
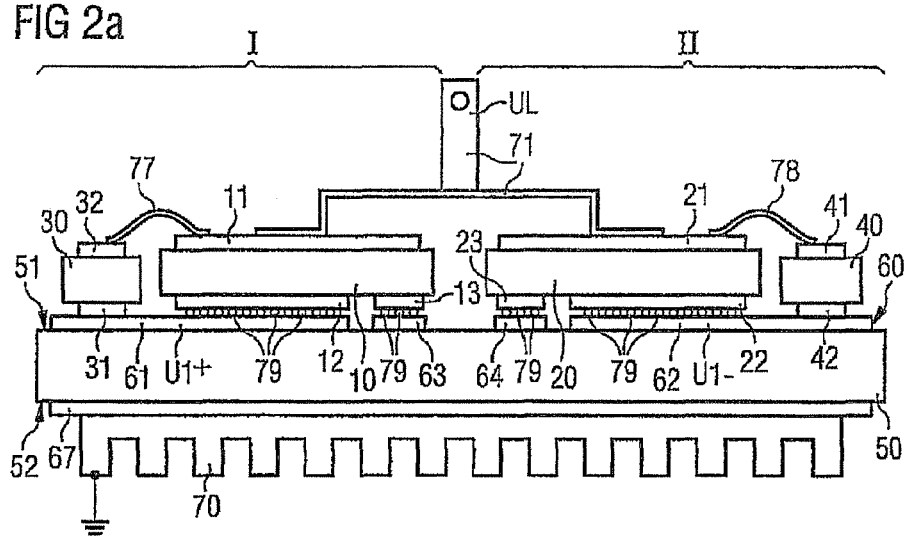
FIG. 2 illustrates one embodiment of a power semiconductor assembly that is formed as a half-bridge, with two mutually complementary semiconductor chips which are connected to a carrier in each case in flip-chip arrangement, and also two corresponding circuit diagrams.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The present invention provides a power semiconductor assembly having reduced circuit losses and reduced interference radiation without impairing the heat dissipation of the power semiconductor assembly.

In one embodiment, a power semiconductor assembly according to the invention includes a carrier, a first semiconductor chip and a second semiconductor chip. The first semiconductor chip has a first main connection and a second main connection, which are arranged on mutually opposite sides of the first semiconductor chip. The second semiconductor chip has a first main connection and a second main connection, which are arranged on mutually opposite sides of the second semiconductor chip.

A first side of the carrier is provided with a patterned metallization having a first section and a second section spaced apart from the latter. The first semiconductor chip is arranged on the first side of the carrier and is mechanically and electrically conductively connected to the first section by using its second main connection. The second semiconductor chip is arranged on the first side of the carrier and is mechanically and electrically conductively connected to the second section by using its second main connection.

The first main connection of the first semiconductor chip and the first main connection of the second semiconductor chip are electrically conductively connected to one another and also to a first connection contact provided for the connection of an external load or of an external supply voltage.

Thus, in one embodiment of the power semiconductor assembly, the load connection of the semiconductor chip is arranged on that side of the chip which is remote from the carrier.

If a metallic body, for example, a heat sink and/or a heat accumulator and/or a metal plate and/or a metallic film, is/are arranged on that side of the carrier which is remote from the semiconductor chip, then the coupling capacitance (mentioned in the introduction) formed between the metallic body and the main connection connected to the load connection is reduced by comparison with an arrangement in accordance with the prior art.

The reason for this is primarily the shielding effect brought about by the metallic body, and also the increased distance between the metallic body and the main connection connected to the load connection.

The coupling capacitance can be reduced further since the conductive connection between the load connection and the main connection conductively connected thereto in an arrangement according to the invention requires a smaller area contributing to the coupling capacitance than a corresponding conductive connection in an arrangement in accordance with the prior art, in which at least one section of the metallization that is arranged between the semiconductor chip and the carrier contributes to the coupling capacitance. The section of the metallization is soldered to the semiconductor chip and therefore requires a specific size determined by the size of the relevant soldering area of the semiconductor chip.

In one embodiment, the conductive connection to the load connection only has to be designed for the required current-carrying capacity since the heat dissipation is still effected via that main connection of the first semiconductor chip which faces the carrier.

FIG. 1 illustrates a side view of a power semiconductor assembly according to the invention, which assembly is formed by way of example as a half-bridge. The half-bridge includes an upper half-bridge branch I and a lower half-bridge branch II. The upper half-bridge branch I includes a first semiconductor chip 10 and a first diode 30, and the lower half-bridge branch II includes a second semiconductor chip 20 and a second diode 40. The semiconductor chips 10 and 20 each have a first main connection 11 and 21, respectively, a second main connection 12 and 22, respectively, and also control connections 13 and 23, respectively.

The semiconductor chips 10, 20 are electrically conductively and mechanically connected using their second main connections 12, 22 to first and second sections 61 and 62, respectively, of the patterned metallization 60 arranged on a first side 51 of the carrier 50.

On a second side 52 opposite the first side 51, the carrier 50 has a metallization 67. The carrier 50 is preferably formed from a ceramic, and the metallizations 60, 67 are preferably formed from copper. A heat sink 70 is arranged on the second side 52 in order to dissipate heat loss arising in the semiconductor chips 10, 20 via the second main connections 12, 22 thereof, the patterned metallization 60, the carrier 50 and also the metallization 67 toward the heat sink 70.

In order to realize the half-bridge, the first semiconductor chip 10 and the second semiconductor chip 20 are electrically connected in series. For this purpose, their first main connections 11, 21 are electrically conductively connected to one another. The electrically conductive connection between the first main connections 11, 21 can be effected for example by using a first connection contact 71, which is formed as a stamped, preferably angular, sheet metal strip. The first connection contact 71 can simultaneously be formed for the connection of an external load and is therefore also referred to hereinafter as load connection.

The coupling capacitance C—illustrated symbolically in FIG. 1—between the heat sink 70 and a metallization 67 of the carrier 50 that is conductively connected thereto, on the one hand, and the connection contact 71 and also the first main connections 11, 21 connected thereto, on the other hand, is very low since the dimensioning of the connection contact 71 is essentially only determined by the required current-carrying capacity, but not by a specific heat dissipating capability.

Furthermore, the connection contact 71 and the main connections 11, 21 conductively connected thereto are arranged on that side of the semiconductor chips 10 and 20, respectively, which is remote from the carrier 50, and are therefore spaced apart relatively far from the heat sink 70, which further reduces the coupling capacitance C.

In the present exemplary embodiment, the first semiconductor chip 10 and the second semiconductor chip 20 are embodied as mutually complementary components. By way of example, the first semiconductor chip 10 can be formed as an n-channel field effect transistor, the first main connection 11 of which constitutes the source terminal and the second main connection 12 of which constitutes the drain terminal. The first semiconductor chip 10 can likewise also be formed as a bipolar npn transistor, in which the first main connection 11 constitutes the emitter and the second main connection 12 constitutes the collector.

Correspondingly, the second semiconductor chip 20 complementary to the first semiconductor chip 10 can be formed as a p-channel field effect transistor, the first main connection 21 of which constitutes the source terminal and the second main connection 22 of which constitutes the drain terminal. The second semiconductor chip 20 can likewise also be formed as a bipolar npn transistor, the first main connection 21 of which constitutes the emitter and the second main connection 22 of which constitutes the collector.

The diodes 30, 40 are reverse-connected in parallel with the load paths of the first and second semiconductor chip 10, 20, respectively, and serve to protect the respective semiconductor chip 10, 20 against voltage spikes such as may arise if an inductive load, for example a motor, is connected to the relevant first load connection 11 and 21, respectively. For this purpose, the cathode 31 of the first diode 30 is electrically conductively connected to the first section 61 of the patterned metallization 60. The anode 32 of the first diode 30 is electrically conductively connected to the first main connection 11 of the first semiconductor chip 10 by using a bonding wire 77.

Correspondingly, the second diode 40 is electrically conductively connected by its anode 42 to the second section 62 of the patterned metallization 60, while the cathode 41 of the second diode 40 is electrically conductively connected to the first main connection 21 of the second semiconductor chip 20 by using a bonding wire 78.

The half-bridge is fed with a positive supply voltage U1+ and a negative supply voltage U1−. For this purpose, as is not illustrated in greater detail in FIG. 1, the positive supply voltage U1+ is fed to the first section 61 of the patterned metallization 60 and the negative supply voltage U1− is fed to the second section 62 of the patterned metallization 60.

The heat loss arising in the semiconductor chips 10, 20 can be led away via the second main connections 12 and 22, respectively, thereof and also via the carrier 50 with its metallizations 60, 67 toward a heat sink 70, which is arranged on that side of the carrier 50 which is remote from the semiconductor chips 10, 20 and is thermally contact-connected to the carrier.

Instead of the heat sink 70 or between the heat sink 70 and the carrier 50 it is also possible to arrange a heat accumulator, a metallic plate, a metallic film or any desired metallic body.

Through corresponding driving of the control connections 13, 23 of the first and second semiconductor chip 10 and 20, respectively, the positive supply voltage U1+ and the negative supply voltage U1− of the half-bridge can be switched through to the load connection 71, the upper half-bridge branch I and the lower half-bridge branch II preferably not being activated simultaneously.

FIGS. 1b and 1c illustrate circuit diagrams in accordance with the arrangement from FIG. 1a, a preferably inductive load 100 additionally being connected to the load connection 71. In the circuit diagram in accordance with FIG. 1b, the first semiconductor chip 10 is formed as an n-channel field-effect transistor and the second semiconductor chip 20 is formed as a p-channel field effect transistor.

In the circuit diagram in accordance with FIG. 1c, the first semiconductor chip 10 is formed as a bipolar npn transistor and the second semiconductor chip 20 is formed as a bipolar pnp transistor.

FIG. 2a likewise illustrates a power semiconductor assembly formed as a half-bridge, in which assembly the first semiconductor chip 10 and the second semiconductor chip 20 are formed as mutually complementary components. By way of example, the first semiconductor chip 10 can be formed as a p-channel field-effect transistor or as a bipolar pnp transistor and the second semiconductor chip 20 can be formed as an n-channel field effect transistor or as a bipolar npn transistor.

As in the case of the half-bridge in accordance with FIG. 1a, in one embodiment of the half-bridge in accordance with FIG. 2a, too, the first main connections 11, 21 are electrically conductively connected to one another and also to the load connection 71. In this case, the first semiconductor chip 10 and the second semiconductor chip 20 are connected to the patterned metallization 60 of the carrier 50 in flip-chip arrangement. This means that the semiconductor chips 10, 20 are connected to the patterned metallization 60 of the carrier 50 not by their drain terminals or collector connections but rather by their source terminals or emitter connections and in one embodiment also by the control connections 13, 23. For this purpose, in accordance with one embodiment, the connection between the second main connections 12, 22 and the sections 61 and 62, respectively, of the metallization 60 and also between the control connections 13, 23 and the sections 63 and 64, respectively, of the metallization 60 is produced as a soldering connection by using "solder bumps" 79. One or a plurality of these connections can likewise also be produced over the whole area, for example by using soldering or by using low-temperature connecting technology such as e.g., pressure sintering. For making contact with the second main connections 12, 22 and also the control connections 13, 23, the patterned metallization 60 has sections 61, 62, 63 and 64 that are spaced apart from one another.

Figure 2B:
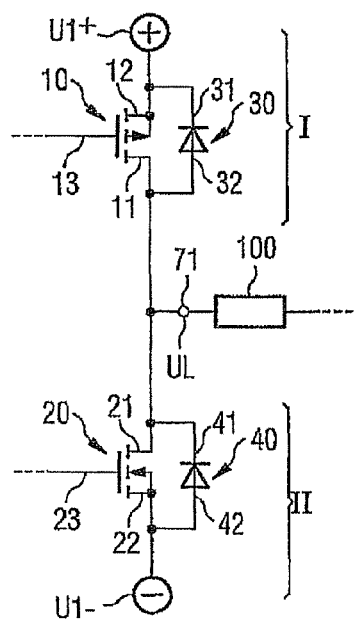
Figure 2C:
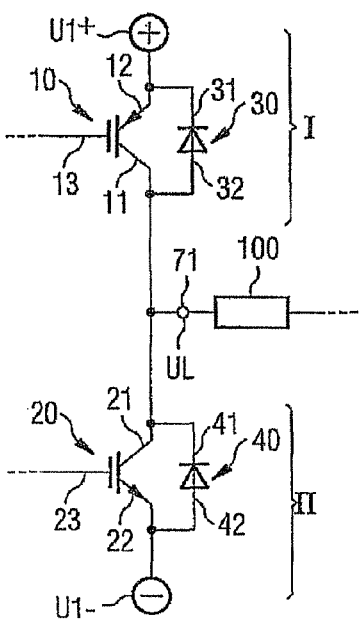

FIGS. 2b and 2c illustrate circuit diagrams regarding the arrangement in accordance with FIG. 2a, wherein in FIG. 2b, by way of example, the first semiconductor chip 10 is formed as a p-channel field-effect transistor and the second semiconductor chip 20 is formed as an n-channel field-effect transistor. In the exemplary embodiment in accordance with FIG. 2c, the first semiconductor chip 10 is formed as a bipolar pnp transistor and the second semiconductor chip 20 is formed as a bipolar npn transistor.

FIG. 3a likewise illustrates a power semiconductor assembly according to the invention that is formed as a half-bridge. In this case, the first semiconductor chip 10 and the second semiconductor chip 20 are formed as equivalent components, wherein the second semiconductor chip 20 is fixed in flip-chip arrangement to a second section 62 of the patterned metallization 60 of the carrier 50 and is electrically conductively connected thereto.

The first main connections 11, 21 are electrically conductively connected to one another and also to a load connection 71. As can be seen in conjunction with FIGS. 3b and 3c, the first semiconductor chip 10 may be an n-channel field-effect transistor, the first main connection 11 of which is the source terminal and the second main connection 12 of which is the drain terminal. The first semiconductor chip 10 may likewise also be a bipolar npn transistor, the first main connection 11 of which is the emitter and the second main connection 12 of which is the collector.

Furthermore, the second semiconductor chip 20 may be formed for example as an n-channel field-effect transistor, the first main connection 21 of which is the drain terminal and the second main connection 22 of which is the source terminal. However, the second semiconductor chip 20 may also be formed as an npn transistor, the first main connection 21 of which is the collector connection and the second main connection 22 of which is the emitter connection.

Figure 4A:
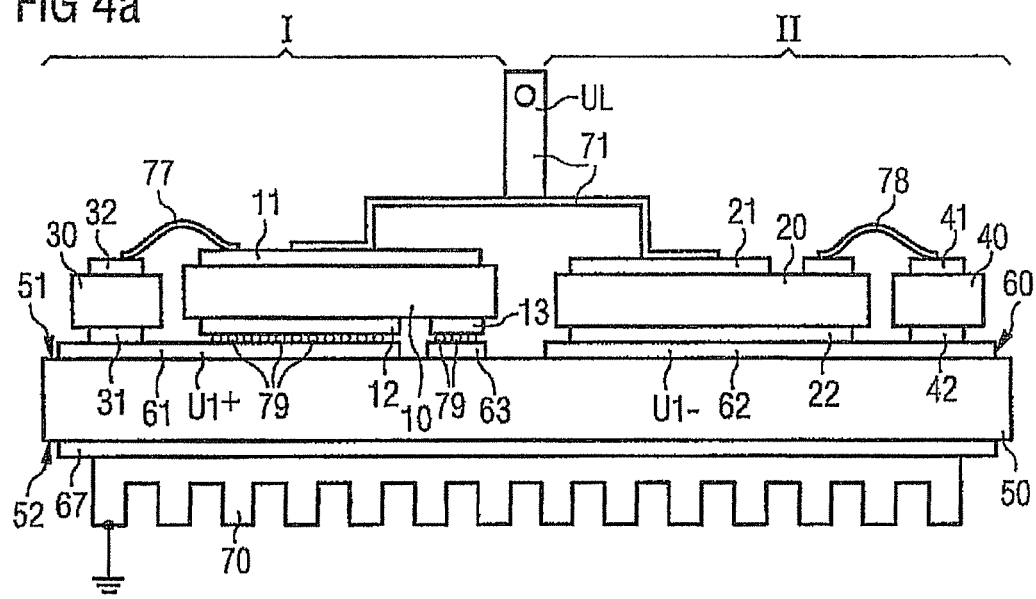
FIG. 4 illustrates one embodiment of a power semiconductor assembly that is formed as a half-bridge, with two equivalent semiconductor chips, of which the semiconductor chip assigned to the upper half-bridge branch is connected to a carrier in flip-chip arrangement, and also two corresponding circuit diagrams.

FIG. 4a also illustrates a power semiconductor assembly formed as a half-bridge with two complementary semiconductor chips 10, 20. In this exemplary embodiment, the first semiconductor chip 10 is connected in flip-chip arrangement to a section 61 of the patterned metallization 60 of the carrier 50.

The first semiconductor chip 10 may be formed for example as a p-channel field effect transistor, the first main connection 11 of which is the drain terminal and the second main connection 12 of which is the source terminal. The first semiconductor chip 10 may likewise be formed as a bipolar pnp transistor, the first main connection 11 of which is the collector connection and the second main connection 12 of which is the emitter connection.

The second semiconductor chip 12 may likewise be formed as a p-channel field-effect transistor, the first main connection 21 of which is the source terminal and the second main connection 22 of which is the drain terminal. The second semiconductor chip 20 may likewise be formed as a bipolar pnp transistor, the first main connection 21 of which is the emitter connection and the second main connection 22 of which is the collector connection.

Figure 4B:
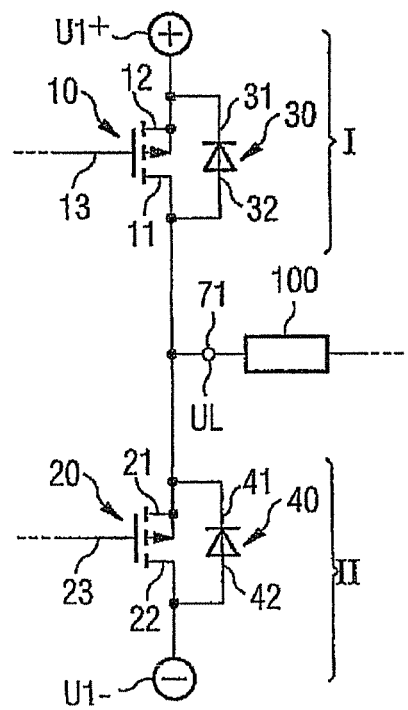
Figure 4C:
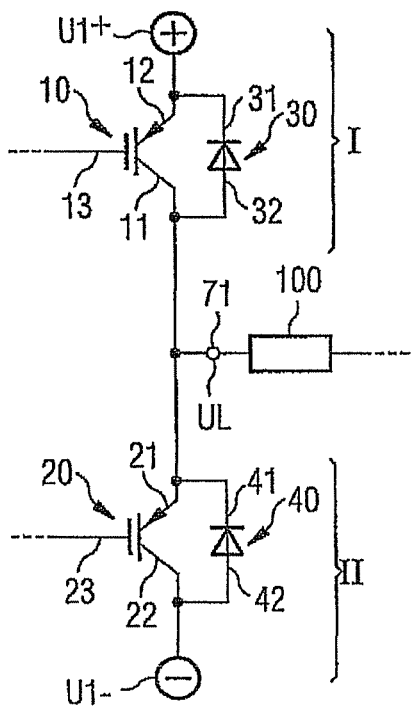

FIGS. 4b and 4c illustrate circuit diagrams for embodiments of the power semiconductor assembly in accordance with FIG. 4a.

In all the exemplary embodiments in accordance with FIGS. 1 to 4, the first semiconductor chip 10 of the upper half-bridge branch I and the second semiconductor chip 20 of the lower half-bridge branch II of a half-bridge are preferably of the same component type, that is to say are either both formed as field effect transistors or both formed as bipolar transistors. Instead of one first semiconductor chip 10, it is also possible for a plurality of semiconductor chips identical thereto to be electrically connected in parallel and be connected preferably by their second sides 12 to a common section 61 of the patterned metallization 60. In a corresponding manner, instead of the second semiconductor chip 20, it is also possible for a plurality of semiconductor chips of this type to be electrically connected in parallel and be connected by their second sides to a common second section 62 of the patterned metallization 60.

In FIGS. 1a, 2a, 3a, 4a, diodes 30, 40 are respectively connected in parallel with a semiconductor chip 10, 20. The essential feature of diodes is a pn junction formed in a semiconductor body. Such a pn junction is generally produced by producing in a doped zone a well doped complementarily with respect to the latter. In this case, the doping of the doped zone is preferably formed by the basic doping of a substrate.

In this case, an n-doped substrate in which a p-doped well is produced is traditionally used. Conversely, however, it is also possible to use a p-doped substrate in which an n-doped well is produced.

In the arrangements in accordance with FIGS. 1 to 4, preferably in each case one of the diodes 30, 40—for example as freewheeling diode—is assigned to one of the semiconductor chips 10, 20. In this case, there is the possibility of integrating the relevant diode 30, 40 in the semiconductor body of the semiconductor chip 10, 20.

In one embodiment, the production of a semiconductor chip 10, 20 involves firstly providing a semiconductor body having a p- or n-type basic doping and producing the structure of semiconductor chips therein. In the case of a semiconductor chip which is formed as a power switch, for example, and in the semiconductor body of which a diode is integrated in the manner described, it may be advantageous if the construction of the diode follows that of the semiconductor chip, that is to say if the semiconductor body of the semiconductor chip has an n-type basic doping, it may be advantageous to produce the anode of the integrated diode as a p-type well, and if the semiconductor body of the semiconductor chip has a p-type basic doping, it may be advantageous to produce the cathode of the integrated diode as an n-type well.

In the case of the arrangements in accordance with FIGS. 1a, 2a, 3a, 4a, the first main connections 11, 21 are connected to one another by using a first connection contact 71 carrying alternating potential. In this case, the first connection contact 71 can both be electrically conductively connected to a section of the patterned metallization 60 and be spaced apart from the metallization 60.

The greater, in the second case, the distance chosen between the metallization 60 and the first connection contact 71 in the vertical direction, the lower the coupling capacitance between the first connection contact 71 and a possibly grounded metallic body 70 arranged on that side of the semiconductor chips 10, 20 which is remote from the carrier 50. In this case, a dielectric or air may be arranged in sections between the first connection contact 71 and the carrier 50.

In accordance with one embodiment of the invention, the distance between the first connection contact 71 and the carrier 50 is greater than or equal to the smaller of the distances between the carrier 50 and the sides of the first load connections 11, 21 that are remote from the carrier.

Figure 5A:
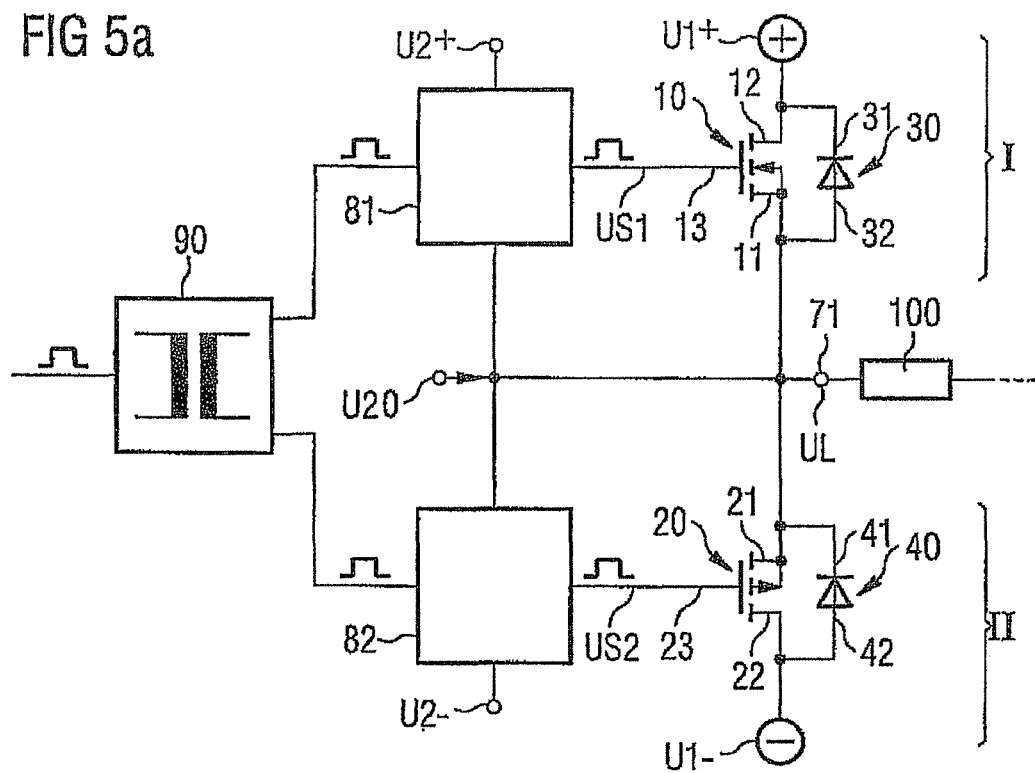
FIG. 5 illustrates one embodiment of the circuit diagram of a half-bridge with two semiconductor chips, each of which is driven by using a separate drive circuit, wherein the two drive circuits are connected to the potential at the load connection of the half-bridge, and also with an electrically isolating drive unit and a voltage supply unit for providing the supply voltage for one or more drive circuits.
Figure 5B:
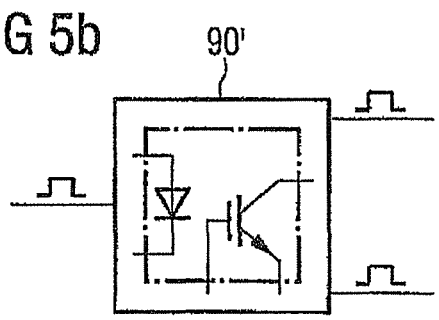

In order to be able to feed the positive supply voltage U1+ or the negative supply voltage U1− of the half-bridge to the load connection 71 in a targeted manner, it is necessary to correspondingly drive the control connections 13, 23 of the semiconductor chips 10 and 20, respectively. As is illustrated in FIG. 5a, this can be effected by using two drive circuits 81, 82, for example.

For driving a field effect transistor, the corresponding drive circuit is connected both to the source terminal and to the control connection.

When driving a bipolar transistor, the corresponding drive circuit is connected to the emitter and to the control connection of the transistor.

This affords one advantage, especially in the case of the exemplary embodiments in accordance with FIGS. 1a, 1b and 1c, that none of the drive circuits has to be connected to the positive or negative supply voltage U1+ or U1− of the half-bridge, such that a potential isolation that is otherwise required owing to the usually high magnitudes of the supply voltages U1+ and U1− is unnecessary.

FIG. 5a illustrates for example a half-bridge in accordance with FIG. 1b to which a load 100 is connected. The control connection 13 of the first semiconductor chip 10 is connected to the output of a drive circuit 81, and the control input 23 of the second semiconductor chip 20 is connected to the output of a second drive circuit 82. Furthermore, the first and the second drive circuit 81, 82 are connected to the first main connections 11 and 21 of the first and second semiconductor chips 10 and 20, respectively.

In order to turn on the first semiconductor chip 10, the first drive circuit 81 relative to the first main connection 11 passes a voltage US1 to the control connection 13 of the first semiconductor chip 10. Correspondingly, the second drive circuit 82, for turning on the second semiconductor chip 20, passes a voltage US2 to the control connection 23 of the second semiconductor chip 20.

Thus, the first semiconductor chip 10 is driven with a first control voltage $\Delta US1=US1-UL$ and the second semiconductor chip 20 is driven with a second control voltage $\Delta US2=UL-US2$. The first and the second control voltages ΔUS1, ΔUS2 are therefore related to the potential UL of the main connections 11, 21 that are electrically conductively connected to one another.

The magnitudes of the first and second control voltages ΔUS1 and ΔUS2, respectively, output by the drive circuits 81, 82 preferably lie in the region of about 15 V. Therefore, there is no need to make particularly stringent requirements of the insulation strength between the drive circuits 81, 82, with the result that it is possible to integrate both drive circuits 81, 82 in a common unit, for example in a common chip housing or a common integrated circuit.

Figure 6A:
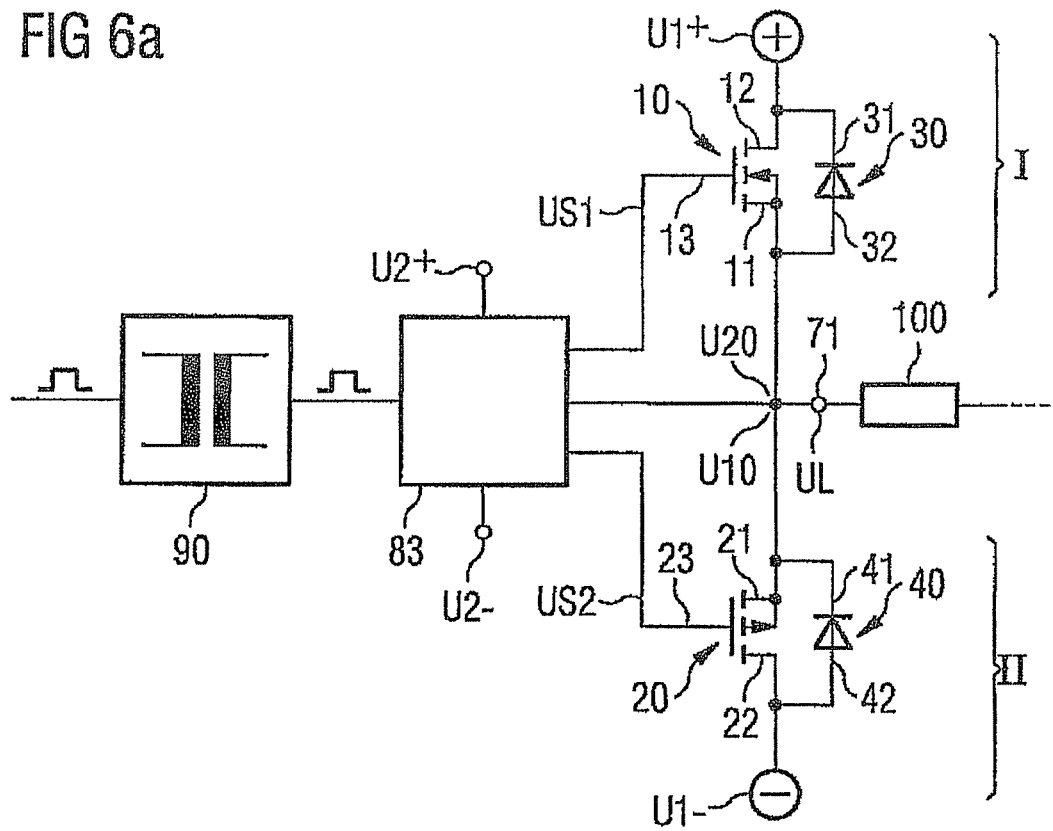
FIG. 6a illustrates a circuit diagram of a half-bridge with two semiconductor chips that are driven by a combined drive circuit.

FIG. 6a illustrates the circuit diagram of a half-bridge with two semiconductor chips that are driven by a combined drive circuit 83. The combined drive circuit 83 is connected, on the output side, to the control inputs 13 and 23 of the first and second semiconductor chips 10, 20, respectively, and also to the load connection 71. The control voltages ΔUS1 and ΔUS2 output to the control inputs 13, 23 by the drive circuit 83 correspond to the control voltages ΔUS1 and ΔUS2, respectively, in accordance with FIG. 5a.

Figure 6B:
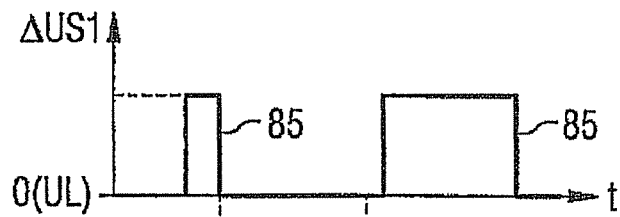

A typical profile of the drive voltage ΔUS1 for driving the first semiconductor chip 10 in accordance with FIG. 6a is illustrated in FIG. 6b. The drive voltage ΔUS1 is illustrated relative to the potential UL of the first main connections 11 and 21 that are conductively connected to one another. The first semiconductor chip 10 is turned on by using a sufficiently positive drive signal 85 of the drive voltage ΔUS1, such that the potential UL essentially corresponds to the positive supply voltage U1+.

The second semiconductor chip 20 is correspondingly turned on by using a sufficiently negative drive signal 86 of the drive voltage ΔUS2, such that the potential UL essentially corresponds to the negative supply voltage U1−.

The drive voltages ΔUS1 and ΔUS2 are coordinated with one another in such a way that both semiconductor chips 10, 20 are never in the on state simultaneously. Between the switching on of one semiconductor chip 10 or 20 and the switching off of the other semiconductor chip 20 or 10, respectively, a dead time Δtd is in each case provided, during which both semiconductor chips 10, 20 are in the off state.

Figure 7A:
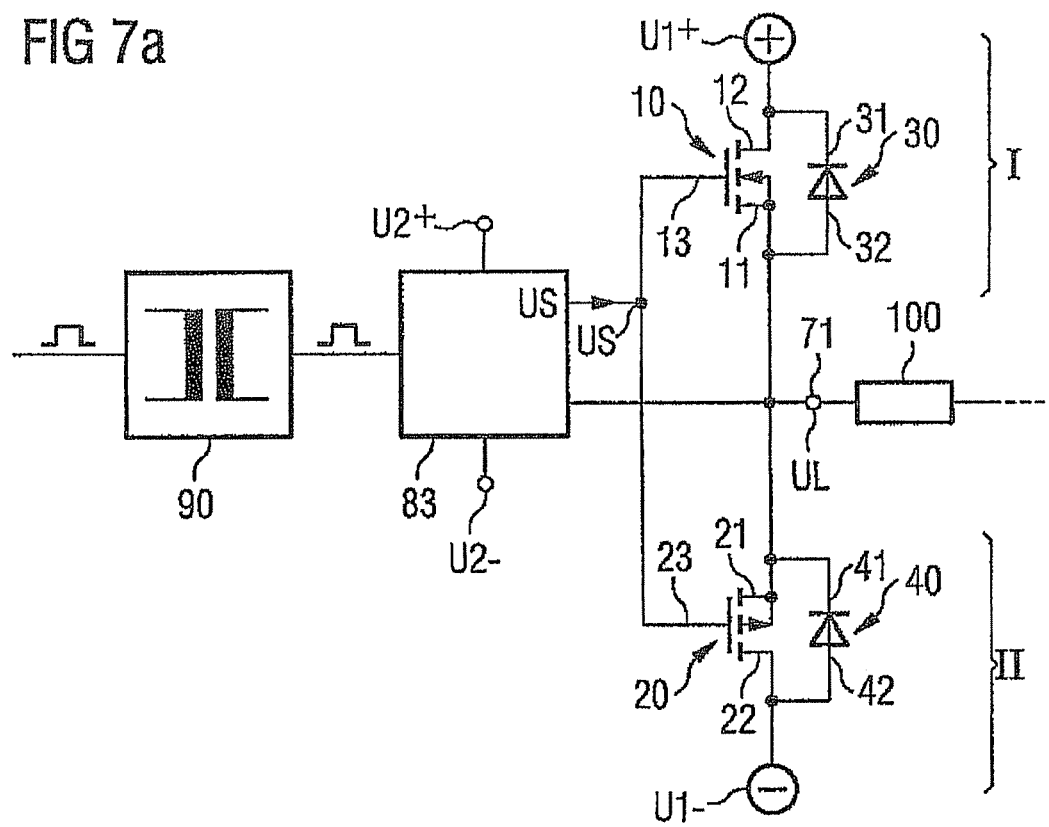
FIG. 7a illustrates a circuit diagram of a half-bridge with two semiconductor chips, the control connections of which are electrically conductively connected to one another and which are driven by a combined drive circuit by voltage pulses having different signs.

A further circuit variant, in which the control inputs 13 and 23 of the first and second semiconductor chips 10 and 20, respectively, are electrically connected to one another, is illustrated in FIG. 7a. The semiconductor chips 10, 20 are driven by using a combined drive circuit 83, which outputs a voltage US to the control inputs 13, 23 connected to one another. A drive voltage ΔUS=US−UL thus acts on the semiconductor chips 10, 20.

Figure 7B:
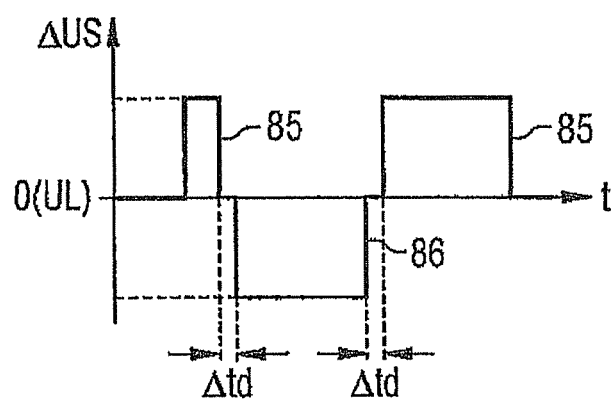

A possible profile of such a drive voltage ΔUS as a function of time t is illustrated in FIG. 7b. The drive voltage ΔUS has, relative to the voltage UL of the load connection, positive pulses 85, which turn on the first semiconductor chip 10, and also negative pulses 86, which turn on the second semiconductor chip 20. Temporally adjacent positive and negative pulses 85, 86, respectively, are once again separated by a dead time Δtd.

Owing to the low magnitudes of the control voltages ΔUS1 and ΔUS2, it suffices, moreover, to provide only a single, common and electrically isolating drive unit 90 for the two drive circuits 81, 82 in accordance with FIG. 5a or for a combined drive circuit 83 in accordance with FIGS. 6a and 7a, the secondary side of the drive unit being electrically conductively connected both to an input of the first drive circuit 81 and to an input of the second drive circuit 82. Consequently, a potential isolation point can be saved on account of the circuit arrangement according to the invention.

A further advantage that arises by virtue of a common drive circuit such as is illustrated e.g., in FIGS. 5a-c, 6a and 7 is the possibility of integrating into the drive circuits 81 and/or 82 in accordance with FIG. 5a and also into the drive circuits 83 in accordance with FIG. 6a or 7a a latching circuit (exclusive-OR circuit), which prevents the first semiconductor chip 10 and the second semiconductor chip 20 from being in the on state simultaneously, without potential-isolation measures being required. This makes it possible, on the one hand, to reduce switching delays (dead times Δtd) and, on the other hand, costs for potential isolation.

The drive unit 90 in one embodiment includes a coreless transformer, which is in one embodiment integrated in one of the drive circuits 81, 82 or 83. Instead of an electrically isolating drive unit 90 realized with a coreless transformer, it is also possible to provide an electrically isolating drive unit 90' in accordance with FIG. 5b, in which the electrical isolation is effected by using an optocoupler. Such a coreless transformer or optocoupler of such a drive unit 90 can optionally be integrated into a common chip housing of the drive circuits 81 and 82.

The drive circuits 81, 82 in the circuit arrangement in accordance with FIG. 5a are electrically conductively connected to the load connection 71 and output, relative to the potential UL thereof, control voltages ΔUS1 and ΔUS2 to the control inputs 13 and 23, respectively. As a result, it is possible to supply both drive circuits 81, 82 from a common voltage supply unit that is insulated from the primary side of the drive unit 90. Such voltage supply units are typically formed as DC converters (DC-DC converters) and include a transformer.

Figure 5C:
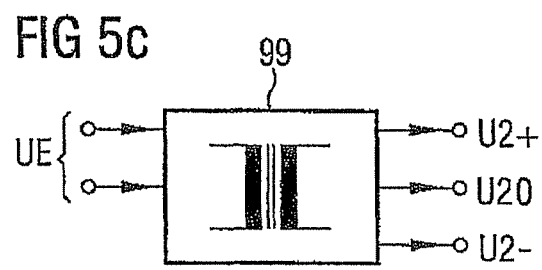

A voltage supply unit 99 of this type is illustrated in FIG. 5c. The voltage supply unit 99 generates from an input voltage difference UE a positive output voltage U2+, a negative output voltage U2− and also an output voltage U20 in between. The output voltage U20 is electrically conductively connected to the load connection 71, to which the first and second drive circuits 81 and 82, respectively, are also connected. Furthermore, the positive output voltage U2+ is connected to the first drive circuit 81 and the negative output voltage U2− is connected to the second drive circuit 82. In particular a transformer required in a second voltage supply unit is obviated by virtue of the common feeding of the two drive circuits 81, 82 from a common voltage supply unit 99.

Figure 8:
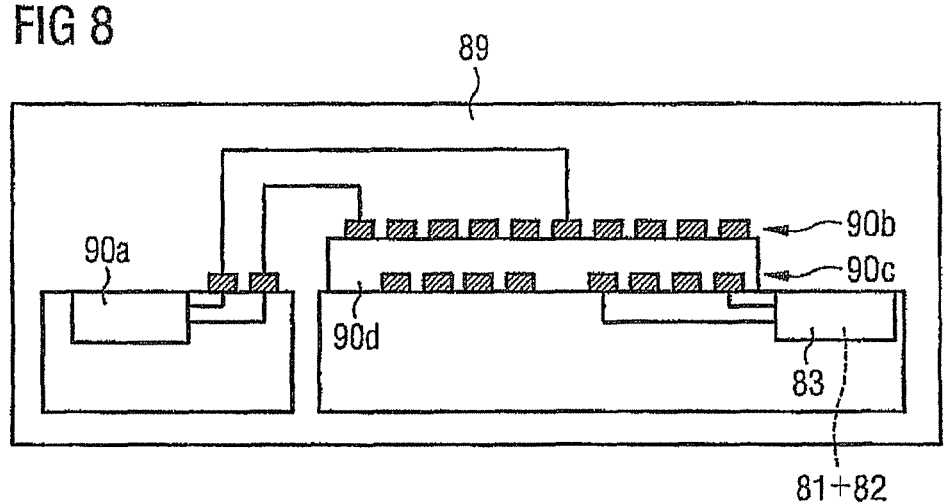
FIG. 8 illustrates a cross section through a drive unit with potential isolation point and a drive circuit, which are arranged in a common housing.

FIG. 8 illustrates a drive component with a drive unit and a drive circuit for driving a half-bridge, which are arranged in a common housing 89.

The drive unit includes a drive IC 90a and also a coreless transformer essentially formed from a primary winding 90b and a secondary winding 90c. The primary winding 90b and the secondary winding 90c are insulated from one another by using an insulator 90d and together form a potential isolation point.

A drive circuit of this type can be used for example as drive circuit 90 in accordance with FIG. 5a, 6a or 7a.

The drive circuit can be formed—as illustrated in FIG. 8—as combined drive circuit 83 corresponding to the drive circuit 83 in accordance with FIG. 6a or 7a or can alternatively be formed—as not illustrated in FIG. 8—as a first and a second drive circuit 81, 82 corresponding to the drive circuits 81, 82 in accordance with FIG. 5a.

Figure 9:
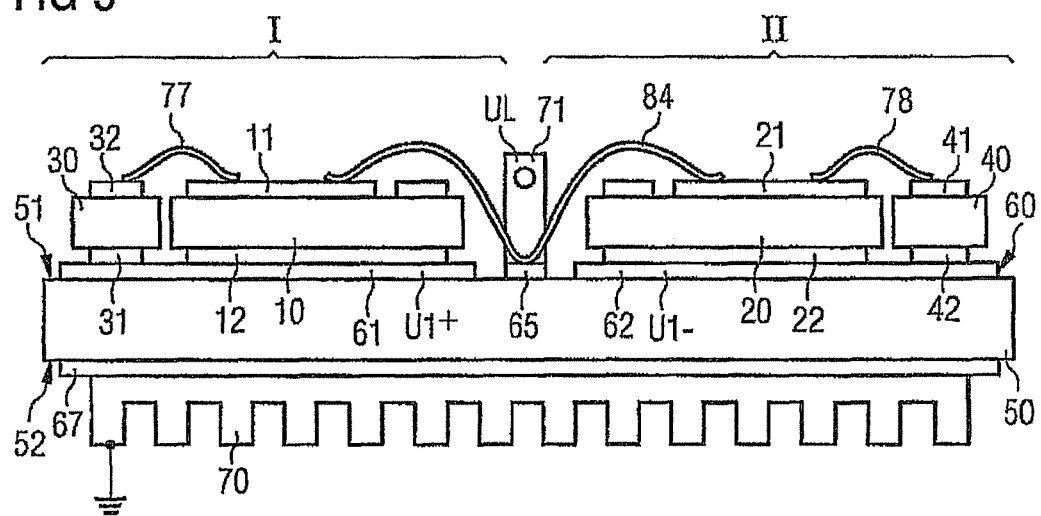
FIG. 9 illustrates a cross section through a half-bridge with two semiconductor chips, in which the load connection is electrically connected to the first main connections by using an interconnect.

A connection contact 71 that electrically connects the first main connections 11, 21 to one another was elucidated in FIG. 1a. A further exemplary embodiment of an electrically conductive connection between the first main connections 11, 21 is illustrated in FIG. 9. In this case, the metallization 60 of the carrier 50 has a fifth section 65, e.g., an interconnect, which is conductively connected to a connection contact 71 and which is electrically conductively connected to the first main connections 11, 21 by using a bonding wire 84.

In this exemplary embodiment too, the coupling capacitance between the heat sink 70 and the metallization 67, on the one hand, and the load connection 71, the first main connections 11, 21, the fifth section 65 of the metallization 60 and the bonding wire 84, on the other hand, in particular on account of the small dimensions of the fifth section 65, is likewise very low even though the fifth section 65 is arranged in the plane of the metallization 60 and thus close to the metallization 67 and to the heat sink 70.

Figure 10:
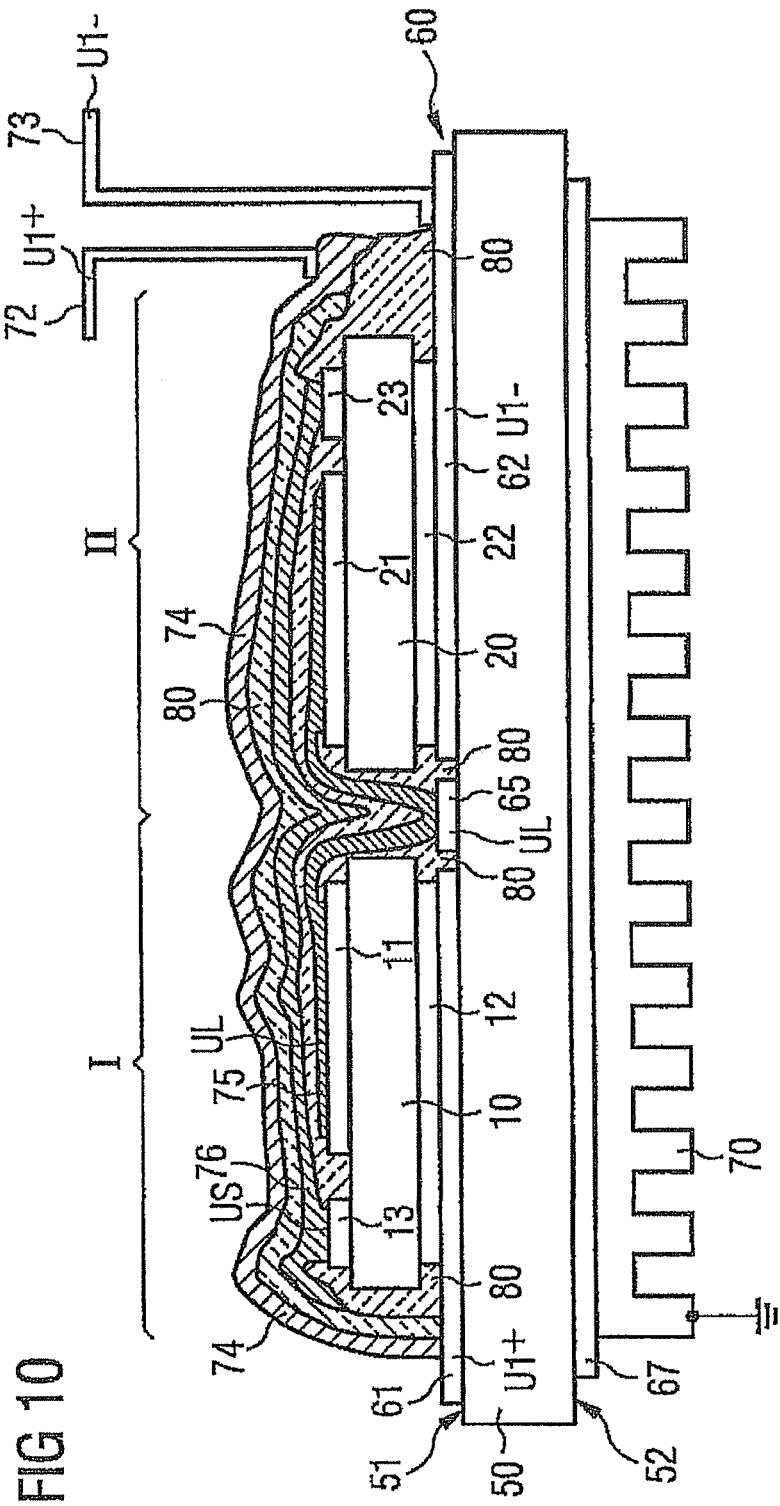
FIG. 10 illustrates a cross section through a half-bridge with two semiconductor chips that are contact-connected by using a film technique.

FIG. 10 illustrates a cross section through a half-bridge with two semiconductor chips 10, 20 that are contact-connected by using a film technique. The semiconductor chips 10, 20 are connected in series and are electrically conductively connected to one another by their first main connections 11, 21. The arrangement of the semiconductor chips 10, 20 essentially corresponds to that from FIGS. 1a and 9, wherein in principle arrangements in accordance with FIGS. 2a, 3a and 4a can also be realized by using a correspondingly adapted film technique.

The film technique includes in each case an electrically conductive first, second and third metal film 74, 75 and 76, respectively, which are insulated from one another by using electrically insulating films 80.

A second connection contact 72, which is electrically conductively connected to the first metal film 74, is provided for feeding a positive supply voltage U1+ to the second main connection 12 of the first semiconductor chip 10.

Correspondingly, a third connection contact 73, which is electrically conductively connected to the second section 62 of the patterned metallization, is provided for feeding a negative supply voltage U1– to the second main connection 22 of the second semiconductor chip 20.

The first connection contact 71—not discernible in this view—once again constitutes the load connection of the half-bridge and is electrically conductively connected to the second metal film 75, which electrically connects the first main connections 11, 21 of the first and second semiconductor chips 10 and 20, respectively, to one another.

Not discernible in FIG. 10 are the diodes reverse-connected in parallel with the load paths of the semiconductor chips 10, 20 according to the diodes 30, 40 in accordance with FIGS. 1a and 9, since, in the case of the half-bridge in accordance with FIG. 10, they are arranged behind the semiconductor chips 10, 20 and concealed by the latter. The reverse-connection in parallel of the diodes is preferably effected by using the same film technique that is also used for connecting the semiconductor chips 10, 20.

The second and third connection contacts 72 and 73, respectively, and preferably also the first connection contact (not illustrated) are arranged on that side of the second semiconductor chip 20 which is remote from the first semiconductor chip 10 and essentially run parallel to one another, preferably perpendicular to the carrier 50, and preferably extend approximately over the width of the carrier 50.

Given such an interconnection, the load current flows—presupposing an external load connected to the first connection contact—with the first semiconductor chip 10 turned on and the second semiconductor chip 20 turned off, proceeding from the second connection contact 72 via the first metal film 74 away from the second connection contact 72 and then in the opposite direction via the first section 61 of the metallization 60, the load path of the first semiconductor chip 10 and the second metal film 75 and the fifth section 65 of the patterned metallization 60, the fifth section being electrically conductively connected to the film, to the first connection contact.

Correspondingly, the current flows, with the first semiconductor chip 10 turned off and with the second semiconductor chip 20 turned on, proceeding from the first connection contact via the fifth section 65 of the metallization, the second metal film 75 away from the first connection contact, and then in the opposite direction via the load path of the second semiconductor chip 20 and the second section 62 of the metallization 60 to the third connection contact 73.

In each of the two cases, the load current firstly flows away from the region of the connection contacts and then again flows in the opposite direction toward the region of the connection contacts, whereby undesirable interference radiation is reduced.

Optionally, the connection contacts 72, 73, 74 can also be arranged on that side of the first semiconductor chip 10 which is remote from the second semiconductor chip 20.

In arrangements in which an alternating potential, for example the load potential UL, is present at a section of the patterned metallization 60 such as the fifth section 65 in the case of FIGS. 9 and 10, the area of the section can be chosen to be smaller than in the case of the prior art. This is because, in the case of the prior art, the section is areally connected to a respective load connection of the first and second semiconductor chips and, consequently, its area is determined by the areas of the relevant load connections.

In accordance with one embodiment of the invention, the area of a section 65 of the metallization 60 that carries an alternating potential, in particular an alternating load potential UL, is less than or equal to 30% of the smallest of the areas of the main connections 11, 12, 21, 22 of the first and second semiconductor chips 10, 20.

Figure 11:
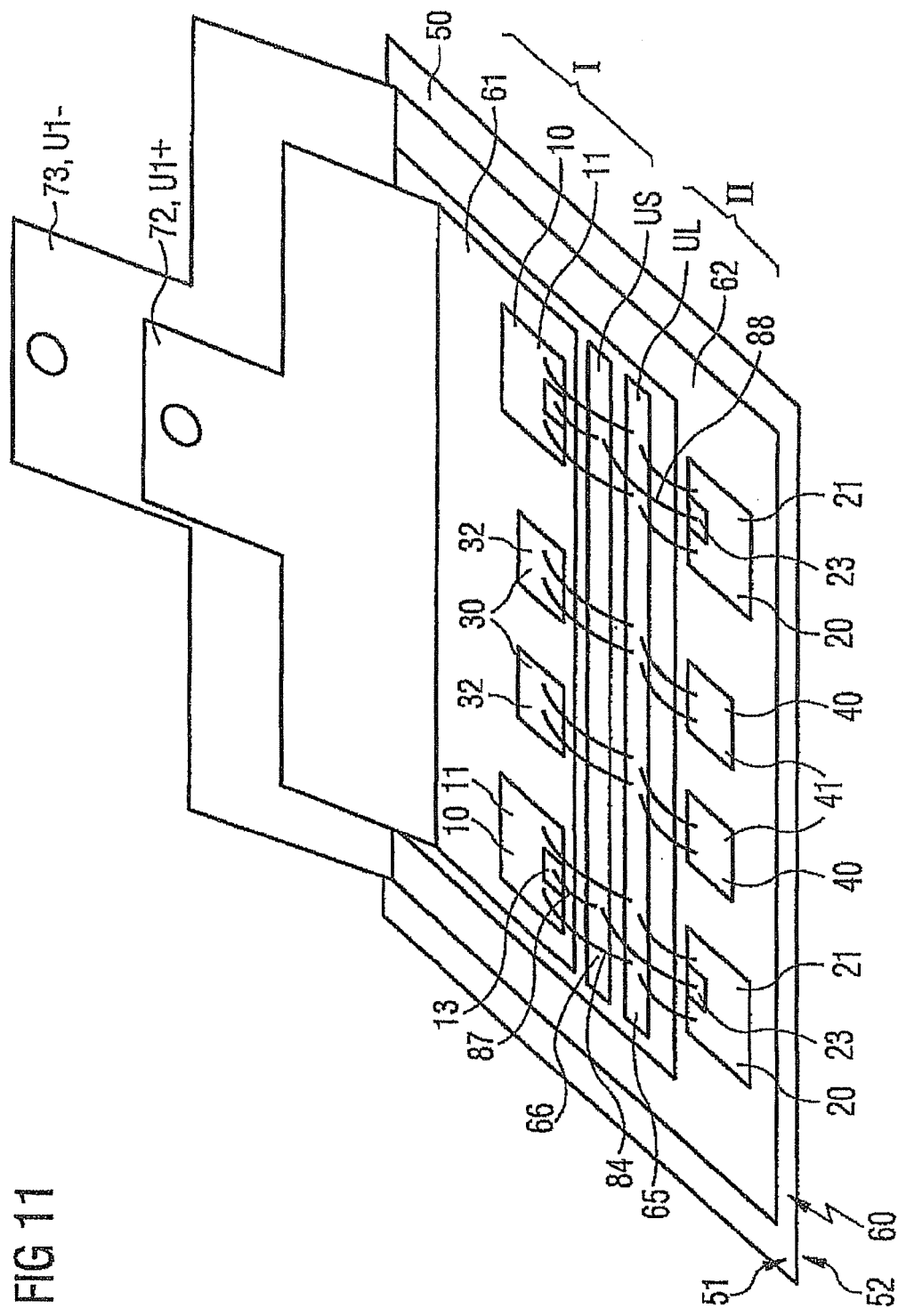
FIG. 11 illustrates a perspective view of a half-bridge in which each half-bridge branch has a plurality of semiconductor chips which are connected in parallel with one another, the first main connections of which are electrically connected to the load connection and the control connections of which are electrically connected to one another.

FIG. 11 illustrates a perspective view of a half-bridge. The upper half-bridge branch I has two first semiconductor chips 10 connected in parallel with one another, and the lower half-bridge branch II has two second semiconductor chips 20 connected in parallel with one another.

The first semiconductor chips 10 are soldered by their second main connections 12 onto a first section 61, and the second semiconductor chips 20 are soldered by their second main connections 22 onto a second section 62 of the patterned metallization 60.

The first main connections 11, 21 of the semiconductor chips 10, 20 are connected, by using bonding wires 84, to a fifth section 65 of the patterned metallization 60, to which section an external load can be connected by using a first connection contact (not illustrated).

The control connections 13 and 23 of the semiconductor chips 10, 20, respectively, are connected, by using bonding wires 87 and 88, respectively, to a sixth section 66 of the patterned metallization 60 and thus also to one another according to the circuit diagram in accordance with FIG. 7a. A control voltage US corresponding to the control voltage US in accordance with FIGS. 7a and 7b can be fed to the control connections 13, 23 via the sixth section 66.

The first section 61 of the metallization 60 is electrically connected to a second connection contact 72 formed areally. The second section 62 has two extensions that reach around the first section 61 and are electrically connected to a third connection contact 73 likewise formed areally. The second connection contact 72 and the third connection contact 73 serve for feeding a positive and negative supply voltage U1+ and U1-31 , respectively, to the half-bridge.

Figure 12:
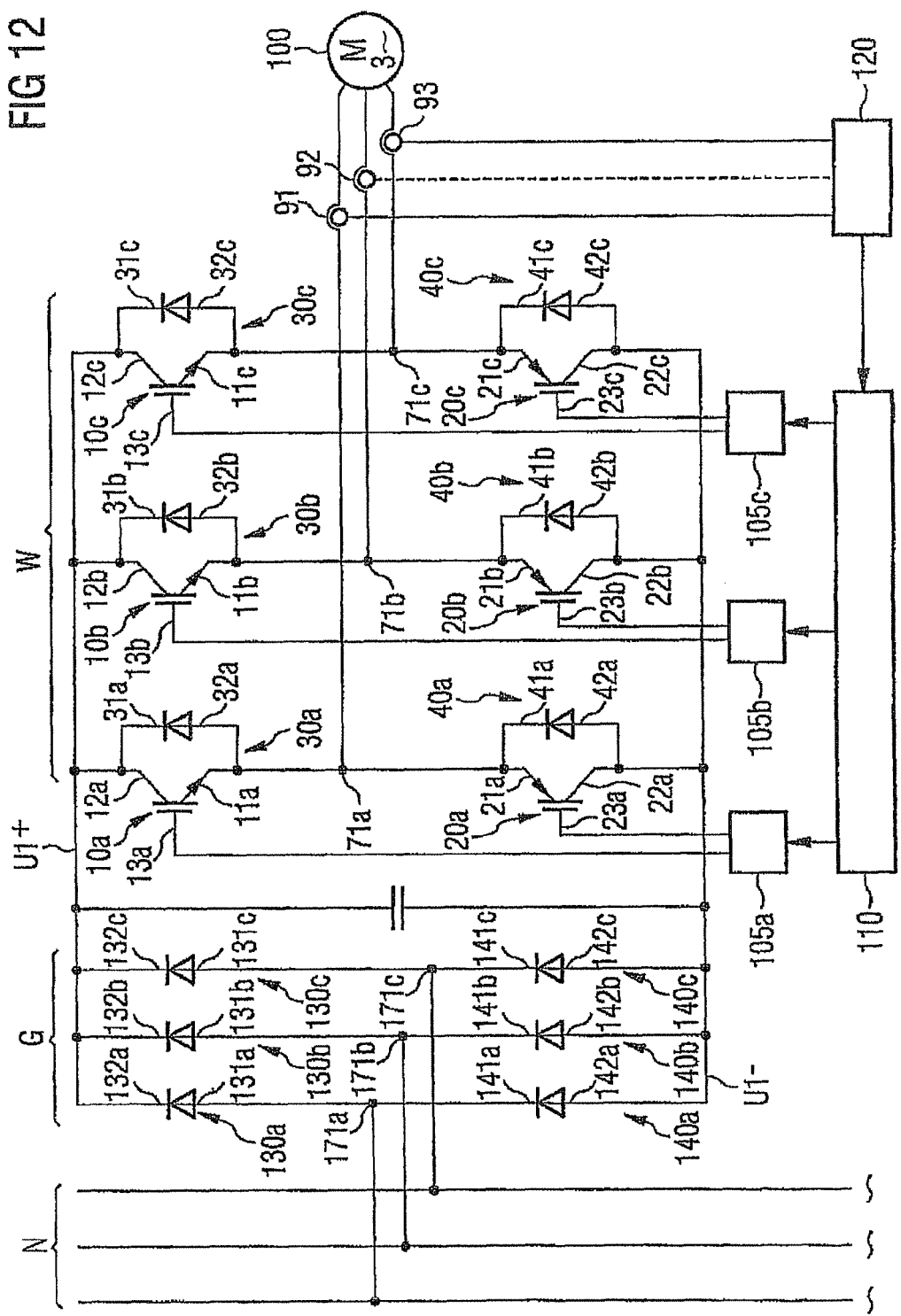
FIG. 12 illustrates a circuit diagram of a converter—connected to a power supply system—with rectifier connected upstream.

FIG. 12 illustrates a circuit diagram of a converter connected to an AC power supply system N, a load 100 once again being connected to the converter.

The inverter W includes three half-bridges realized with IGBTs 10a, 20a, 10b, 20b, 10c, 20c and diodes 30a, 40a, 30b, 40b, 30c, 40c. Each half-bridge is driven by a driver electronic unit 105a, 105b, 105c. Each of the driver electronic units 105a, 105b, 105c includes a drive circuit and a drive unit corresponding to the drive circuit 83 and the drive unit 90 in accordance with FIG. 6a. As an alternative thereto, however, it is possible for one or more of the half-bridges also to be driven according to the circuits in accordance with FIG. 5a-c or 7a, 7b.

A load 100 formed as a motor is connected to the load connections 71a, 71b and 71c of the half-bridges. By using a first, second and third current sensor 91, 92 and 93 respectively—the second current sensor 92 being optional—a monitoring electronic unit 120 determines the load currents of the half-bridges and their phase angles with respect to one another and forwards the data determined to a control electronic unit 110, which drives the driver electronic units 105a, 105b, 105c for the individual half-bridges in a manner dependent on the data.

The positive and the negative supply voltage U1+ and U1−, respectively, of the half-bridge is generated by using a rectifier G having six diodes 130a, 140a, 130b, 140b, 130c, 140c and also a capacitor C0. Instead of the diodes 130a, 140a, 130b, 140b, 130c, 140c of the rectifier G, a thyristor can also be provided in each case (in this respect, also see FIG. 14).

The rectifier G is fed by the power supply system N via connections 171a, 171b, 171c. Alternating potential is therefore present at the connections 171a, 171b, 171c, which are conductively connected to first main connections 131a, 131b, 131c, 141a, 141b, 141c, of the diodes 130a, 140a, 130b, 140b, 130c, 140c or thyristors, with the result that in this case, too, on account of coupling capacitances between the diodes 130a, 140a, 130b, 140b, 130c, 140c or thyristors and connection lines and contact areas electrically connected thereto, on the one hand, and a metallic body, for example a heat sink, on the other hand, circuit losses can occur due to charge reversal processes or due to electromagnetic emission.

The diodes 130a, 140a, 130b, 140b, 130c, 140c or thyristors are preferably formed as semiconductor chips, arranged on the first side of a carrier and connected by using their second sides 132a, 142a, 132b, 142b, 132c, 142c to a metallization of the first side of the carrier. A metallic body, e.g., a heat sink, is preferably arranged on a second side—opposite the first side—of the carrier and is thermally connected to the semiconductor chips. In the case of an arrangement of this type, the first main connections 131a, 131b, 131c, 141a, 141b, 141c are in one embodiment arranged on that side of the relevant semiconductor chips which is remote from the carrier.

Figure 13:
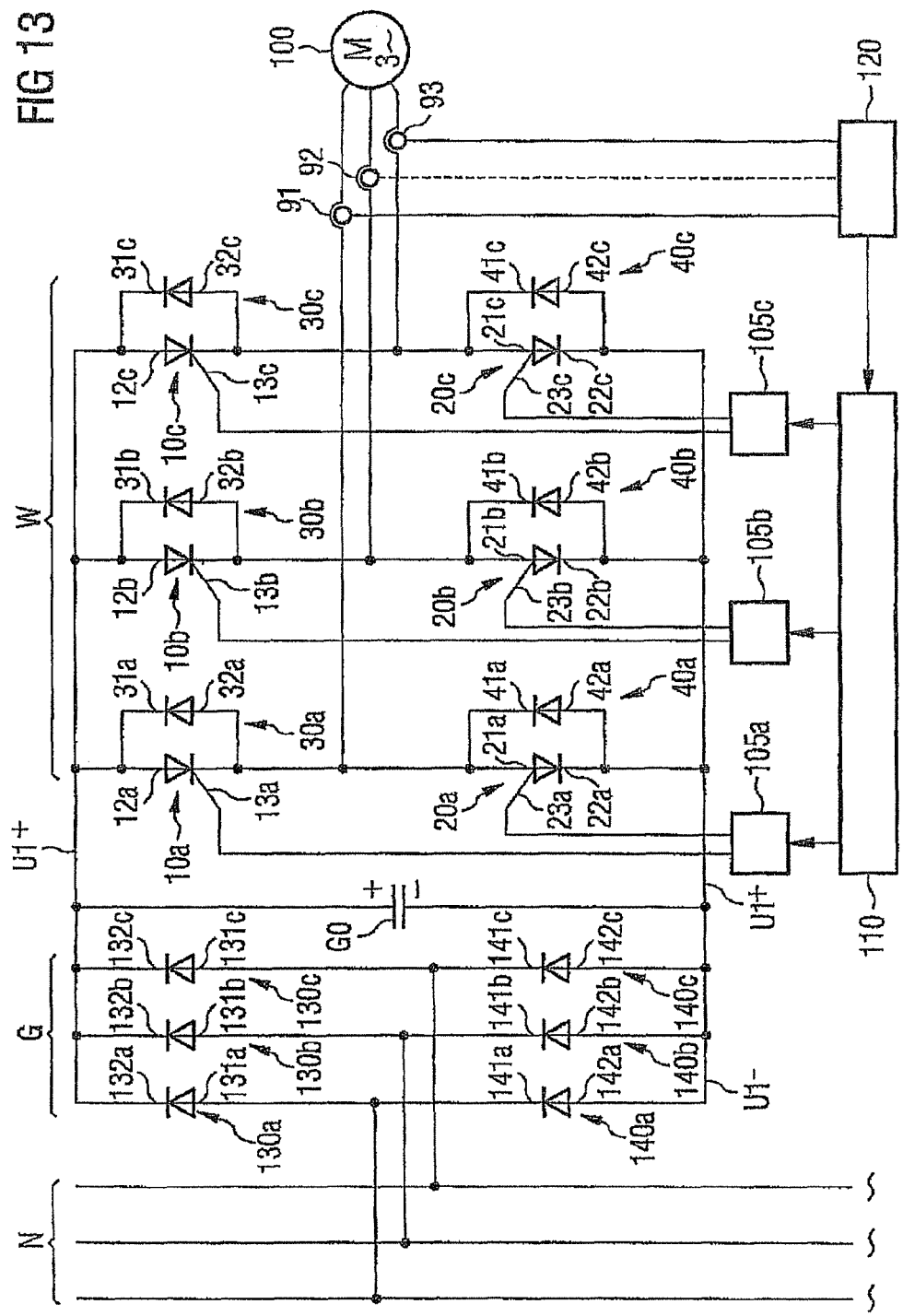
FIG. 13 illustrates a circuit diagram in accordance with FIG. 12, in which thyristors are provided instead of IGBTs.

FIG. 13 illustrates a circuit diagram of a rectifier G connected to a power supply system N and of a converter W connected downstream, such as is already known from FIG. 12, although in the case of the converter W in accordance with FIG. 13 thyristors are provided instead of IGBTs in the case of the converter W in accordance with FIG. 12.

In this case, in accordance with one embodiment, the first semiconductor chips 10a, 10b, 10c are formed as p-controlled thyristors and the second semiconductor chips 20a, 20b, 20c are formed as n-control thyristors, which has the advantage that a common driver electronic unit 105a, 105b and 105c can be used without potential isolation for the driving of the thyristors of a respective half-bridge 10a/20a, 10b/20b, 10c/20c.

Figure 14:
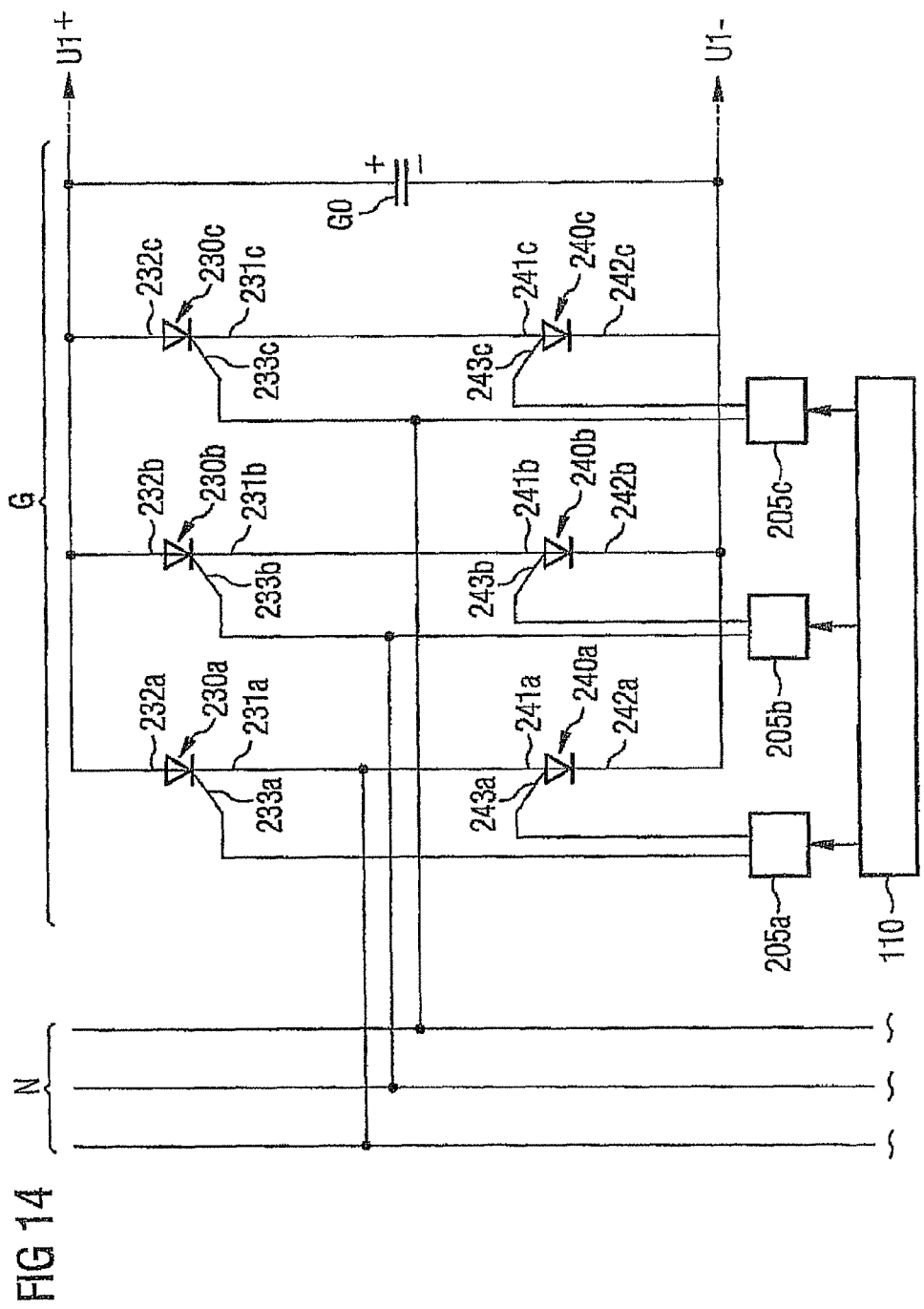
FIG. 14 illustrates a circuit diagram of a rectifier constructed with thyristors.

FIG. 14 illustrates a circuit diagram of a rectifier G connected to a power supply system N. The rectifier G is formed from thyristors and can be used instead of the rectifiers G in accordance with FIG. 11 or 12.

The rectifier G includes three rectifier half-bridges 230a/240a, 230b/240b, 230c/240c, each of which can be constructed like a power semiconductor assembly according to the invention as described with reference to FIGS. 1a, 2a, 3a and 4a, 8, 9, 10, and can be arranged on a carrier.

Figure 6C:
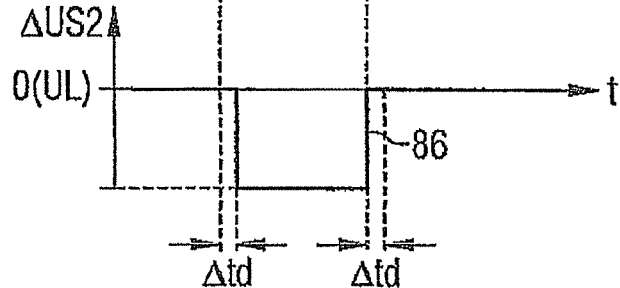

The anode 231a-c of each of the upper thyristors 230a-c is electrically conductively connected to the cathode 241a-c of the respectively corresponding lower thyristor 240a-c. In contrast to the diodes 130a-c, 140a-c of the rectifier G illustrated in FIGS. 11 and 12, the thyristors 230a-c and 240a-c of the rectifier G in accordance with FIG. 14 have to be driven in a suitable manner. For this purpose, a driver electronic unit 205a-c is provided for each rectifier half-bridge 230a/240a, 230b/240b, 230c/240c, which driver electronic units are driven by a common control electronic unit 210. The control connections (gates) 233a/243a, 233b/243b, 233c/243c of a respective rectifier half-bridge 230a/240a, 230b/240b, 230c/240c are driven according to the MOSFET half-bridge 10/20 in accordance with FIGS. 6a-c.

However, a driving according to the MOSFET half-bridges 10/20 in accordance with FIG. 5a-c or 7a, 7b is likewise possible.

A driving in accordance with FIG. 5a-c, 6a-c or 7a, 7b has one advantage that none of the drive circuits 81, 82 or 83 used in this case has to be connected to the output voltage U1+ or U1− of the rectifier half-bridge, and that measures for potential isolation can therefore be dispensed with at this point.

All the converters W described in the present invention can be fed by a power supply system N by using any desired rectifier, in particular by using one of the rectifiers G described.

A power semiconductor assembly according to one embodiment may include in particular one or more half-bridges of a converter W. Likewise, a power semiconductor assembly according to one embodiment may include in particular one or more half-bridges of a rectifier G.

In the case of one embodiment of a power semiconductor assembly, its semiconductor chips are arranged on a patterned metallization of a carrier. Suitable methods for positioning and contact-connecting the semiconductor chips with the patterned metallization are for example as described in WO 03/030247 A2 and in DE 103 20 877 A1.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor assembly comprising:
a first semiconductor and a second semiconductor, each having a first main connection and a second main connection arranged on opposite sides, and a carrier having a patterned metallization with a first section spaced apart from a second section;
the first main connection of the first semiconductor is arranged at a side of the first semiconductor facing away from the carrier;

the first main connection of the second semiconductor is arranged at a side of the second semiconductor facing away from the carrier;

the first semiconductor comprises a first controllable semiconductor switch;

the second semiconductor comprises a second controllable semiconductor switch;

the first controllable semiconductor switch and the second controllable semiconductor switch are electrically connected in series;

the first semiconductor is electrically connected to the first section by its second main connection, and the second semiconductor is electrically connected to the second section by its second main connection;

the first main connection of the first semiconductor forms a first circuit node that is electrically connected between the first controllable semiconductor switch and the second controllable semiconductor switch; and the first main connection of the second semiconductor forms a second circuit node that is electrically connected between the first controllable semiconductor switch and the second controllable semiconductor switch.

2. The assembly of claim 1, wherein a second side, opposite the first side of the carrier, is in thermal contact with a metallic body.

3. The assembly of claim 2, wherein the metallic body is formed as a heat sink or as a heat accumulator or as a metal plate or as a metal film.

4. The assembly of claim 2, wherein the metallic body is grounded.

5. A power semiconductor assembly comprising:
a first semiconductor chip having a first main connection and a second main connection, arranged on mutually opposite sides of the first semiconductor chip;
a second semiconductor chip having a first main connection and a second main connection, arranged on mutually opposite sides of the second semiconductor chip;
a carrier having a first side, provided with a patterned metallization and having a first section spaced from a second section;
the first main connection of the first semiconductor chip is arranged at a side of the first semiconductor chip facing away from the carrier;
the first main connection of the second semiconductor chip is arranged at a side of second semiconductor chip facing away from the carrier;
the first semiconductor chip comprises a first controllable semiconductor switch;
the second semiconductor chip comprises a second controllable semiconductor switch;
the first controllable semiconductor switch and the second controllable semiconductor switch are electrically connected in series;
the first semiconductor chip is connected to the first section by its second main connection;
the second semiconductor chip is connected to the second section by its second main connection;
the first main connection of the first semiconductor chip forms a first circuit node that is electrically connected between the first controllable semiconductor switch and the second controllable semiconductor switch; and
the first main connection of the second semiconductor chip forms a second circuit node that is electrically connected between the first controllable semiconductor switch and the second controllable semiconductor switch.

6. The assembly of claim 5, wherein a second side, opposite the first side of the carrier, is in thermal contact with a metallic body.

7. The assembly of claim 5, wherein the metallic body is formed as a heat sink or as a heat accumulator or as a metal plate or as a metal film.

8. The assembly of claim 6, wherein the metallic body is grounded.

9. The assembly of claim 5, comprising:
a second connection contact configured for the connection of a positive supply voltage; and
a third connection contact configured for the connection of a negative supply voltage; wherein
the second connection contact is electrically conductively connected to the second main connection of the first semiconductor chip;
the third connection contact is electrically conductively connected to the second main connection of the second semiconductor chip; and
the second connection contact and the third connection contact are arranged either on that side of the second semiconductor chip which is remote from the first semiconductor chip, or on that side of the first semiconductor chip which is remote from the second semiconductor chip.

10. The assembly of claim 9, wherein in which the current path from the second connection contact to the first connection contact and the current path from the first connection contact to the third connection contact are essentially directed opposite to one another.

11. The assembly of claim 5, wherein:
the first semiconductor chip is an n-channel field effect transistor, the source terminal of which constitutes the first main connection of the first semiconductor chip and the drain terminal of which constitutes the second main connection of the first semiconductor chip; or
the first semiconductor chip is a p-channel field-effect transistor, the drain terminal of which constitutes the first main connection of the first semiconductor chip and the source terminal of which constitutes the second main connection of the first semiconductor chip; or
the first semiconductor chip is a bipolar npn transistor, the emitter connection of which constitutes the first main connection of the first semiconductor chip and the collector connection of which constitutes the second main connection of the first semiconductor chip; or
the first semiconductor chip is a bipolar pnp transistor, the collector connection of which constitutes the first main connection of the first semiconductor chip and the emitter connection of which constitutes the second main connection of the first semiconductor chip; or
the first semiconductor chip is a thyristor, the cathode of which constitutes the first main connection of the first semiconductor chip and the anode of which constitutes the second main connection of the first semiconductor chip.

12. The assembly of claim 4, wherein:
the second semiconductor chip is an p-channel field effect transistor, the source terminal of which constitutes the first main connection of the second semiconductor chip and the drain terminal of which constitutes the second main connection of the second semiconductor chip; or
the second semiconductor chip is an n-channel field-effect transistor, the drain terminal of which constitutes the first main connection of the second semiconductor chip and the source terminal of which constitutes the second main connection of the second semiconductor chip; or the second semiconductor chip is a bipolar pnp transistor, the emitter connection of which constitutes the first main connection of the second semiconductor chip and the collector connection of which constitutes the second main connection of the second semiconductor chip; or the second semiconductor chip is a bipolar npn transistor, the collector connection of which constitutes the first main connection of the second semiconductor chip and the emitter connection of which constitutes the second main connection of the second semiconductor chip; or the first semiconductor chip is a thyristor, the anode of which constitutes the first main connection of the second semiconductor chip and the cathode of which constitutes the second main connection of the second semiconductor chip.

13. The assembly of claim 5, wherein:
the first semiconductor chip is an n-channel field effect transistor, the source terminal of which constitutes the first main connection of the first semiconductor chip and the drain terminal of which constitutes the second main connection of the first semiconductor chip, or in which the first semiconductor chip is a bipolar npn transistor, the emitter connection of which constitutes the first main connection of the first semiconductor chip and the collector connection of which constitutes the second main connection of the first semiconductor chip; and the second semiconductor chip is an p-channel field effect transistor, the source terminal of which constitutes the first main connection of the second semiconductor chip and the drain terminal of which constitutes the second main connection of the second semiconductor chip, or in which the second semiconductor chip is a bipolar pnp transistor, the emitter connection of which constitutes the first main connection of the second semiconductor chip and the collector connection of which constitutes the second main connection of the second semiconductor.

14. The assembly of claim 5, wherein:
the first semiconductor chip is a p-controlled thyristor, the cathode of which constitutes the first main connection of the first semiconductor chip and the anode of which constitutes the second main connection of the first semiconductor chip; and the second semiconductor chip is an n-controlled thyristor, the anode of which constitutes the first main connection of the second semiconductor chip and the cathode of which constitutes the second main connection of the second semiconductor chip.

15. The assembly of claim 5, wherein the first semiconductor chip and/or the second semiconductor chip is/are a MOSFET.

16. The assembly of claim 5, wherein the first semiconductor chip and/or the second semiconductor chip is/are an IGBT.

17. The assembly of claim 5, wherein the first semiconductor chip and the second semiconductor chip form a half-bridge, wherein the first main connection of the first semiconductor chip and the first main connection of the second semiconductor chip are electrically conductively connected to one another, comprising
a first drive circuit for driving a control input of the first semiconductor chip;
a second drive circuit for driving a control input of the second semiconductor chip; and
wherein the first drive circuit and the second drive circuit are electrically conductively connected both to the first main connection of the first semiconductor chip and to the first main connection of the second semiconductor chip.

18. The assembly of claim 5, comprising:
a first diode, the anode of which is electrically conductively connected to the first main connection of the first semiconductor chip and is formed as a p-type well.

19. The assembly of claim 5, comprising:
a first diode, the cathode of which is electrically conductively connected to the second main connection of the first semiconductor chip and is formed as an n-type well.

20. The assembly of claim 5, comprising:
a second diode, the anode of which is electrically conductively connected to the second main connection of the second semiconductor chip and is formed as a p-type well.

21. The assembly of claim 5, comprising:
a second diode, the cathode of which is electrically conductively connected to the first main connection of the second semiconductor chip and is formed as an n-type well.

22. The assembly of claim 5, comprising:
a second connection contact provided for the provision of a positive supply voltage and a third connection contact provided for the provision of a negative supply voltage;
wherein the second connection contact is electrically conductively connected to the second main connection of the first semiconductor chip;
the third connection contact is electrically conductively connected to the second main connection of the second semiconductor chip; and
the second connection contact and the third connection contact are arranged either on that side of the second semiconductor chip which is remote from the first semiconductor chip, or on that side of the first semiconductor chip which is remote from the second semiconductor chip.

23. The assembly of claim 5, wherein:
the first semiconductor chip is an n-controlled thyristor, the anode of which constitutes the first main connection of the first semiconductor chip and the cathode of which constitutes the second main connection of the first semiconductor chip; and
the second semiconductor chip is a p-controlled thyristor, the cathode of which constitutes the first main connection of the second semiconductor chip and the anode of which constitutes the second main connection of the second semiconductor chip.

24. The assembly of claim 23, wherein the first semiconductor chip and the second semiconductor chip form a rectifier half-bridge, wherein the first main connection of the first semiconductor chip and the first main connection of the second semiconductor chip are electrically conductively connected to one another, comprising
a first drive circuit for driving a control input of the first semiconductor chip;
a second drive circuit for driving a control input of the second semiconductor chip; and
wherein the first drive circuit and the second drive circuit are electrically conductively connected both to the first main connection of the first semiconductor chip and to the first main connection of the second semiconductor chip.

25. The assembly of claim 24, comprising:
a voltage supply unit, having a DC-DC converter containing precisely one transformer and connected both to the first drive circuit and to the second drive circuit and providing for the voltage supply thereof.

26. The assembly of claim 24, comprising:
a drive unit having a primary side and a secondary side electrically isolated from the latter, wherein the secondary side is electrically conductively connected both to an input of the first drive circuit and to an input of the second drive circuit.

27. The assembly of claim 26, wherein the drive unit is an optocoupler or a transformer.

28. The assembly of claim 26, wherein the secondary side, the first drive circuit and the second drive circuit are arranged in a common chip housing or in a common integrated circuit.

29. The assembly of claim 5, wherein the first main connection of the first semiconductor chip and the first main connection of the second semiconductor chip are electrically conductively connected by a metal film.

30. A power semiconductor assembly comprising:
a carrier;
a first semiconductor chip connected to a metallization of a first side of the carrier, wherein the first semiconductor chip has a first main connection and a second main connection, which are arranged on mutually opposite sides of the first semiconductor chip; wherein
the first main connection of the first semiconductor chip is arranged at a side of the first semiconductor chip facing away from the carrier;
the first semiconductor chip comprises a first controllable semiconductor switch; and
the first semiconductor chip is mechanically and electrically conductively connected to a first section of the metallization by means of its second main connection;
a second semiconductor chip connected to the metallization, wherein the second semiconductor chip has a first main connection and a second main connection, which are arranged on mutually opposite sides of the second semiconductor chip; wherein
the first main connection of the second semiconductor chip is arranged at a side of the second semiconductor chip facing away from the carrier;
the second semiconductor chip comprises a second controllable semiconductor switch; and
the second semiconductor chip is mechanically and electrically conductively connected to a second section of the metallization by means of its second main connection; wherein
the first controllable semiconductor switch and the second controllable semiconductor switch are electrically connected in series;
the first main connection of the first semiconductor chip forms a first circuit node that is electrically connected between the first controllable semiconductor switch and the second controllable semiconductor switch; and
the first main connection of the second semiconductor chip forms a second circuit node that is electrically connected between the first controllable semiconductor switch and the second controllable semiconductor switch.

31. The power semiconductor assembly of claim 30, comprising:
a latching circuit preventing the first semiconductor chip and the second semiconductor chip from being switched on simultaneously.

\* \* \* \* \*